(12) United States Patent
Darden

(10) Patent No.: US 6,301,689 B1
(45) Date of Patent: Oct. 9, 2001

(54) SPACING VIOLATION CHECKER

(75) Inventor: Laura R. Darden, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/162,215

(22) Filed: Sep. 28, 1998

(51) Int. Cl.$^7$ .................................................... G06F 17/50
(52) U.S. Cl. ...................... 716/5; 716/2; 716/4; 716/10; 716/11
(58) Field of Search .................................................... 716/5

(56) References Cited

U.S. PATENT DOCUMENTS

| | | | | |
|---|---|---|---|---|
| 5,062,054 | * | 10/1991 | Kawakami et al. | 364/491 |
| 5,247,455 | * | 9/1993 | Yoshikawa | 364/490 |
| 5,625,568 | * | 4/1997 | Edwards et al. | 364/491 |
| 5,689,433 | * | 11/1997 | Edwards | 364/490 |
| 5,946,476 | * | 8/1999 | Tomoda | 395/500.1 |

FOREIGN PATENT DOCUMENTS

| | | | |
|---|---|---|---|
| 08235232-A | 9/1996 | (JP) | G06F/17/50 |

OTHER PUBLICATIONS van der Meijs, N.P. et al., An Efficient Algorithm for Analysis of Non–Orthogonal Layout, IEEE Circuits and Systems, pp. 47–52, May 1989.*

Nunes, R.B. et al., A Novel Approach to Perform Circuit Verification Using Spans, Proceedings on Circuits and Systems, pp. 334–337, Aug. 1995.*

M. Sato et al., A Theoretically Optimal and Practically Fast Algorithm for Geometrical Design Rule Verification, IEEE International Circuits and Systems, pp. 1445–1448, Jun. 1988.*

* cited by examiner

Primary Examiner—Matthew Smith
Assistant Examiner—A. M. Thompson
(74) Attorney, Agent, or Firm—McGinn & Gibb, PLLC; Richard M. Kotulak, Esq.

(57) ABSTRACT

A spacing violation checker that forms conductor rectangles, forms minimum spacing rectangles, identifies possible errors and checks whether possible errors are true errors allows same net spacing errors to be recognized during physical design prior to the design rules check. The software supporting the invention performs orders of magnitude faster than the design rules check solution. As such, the invention dramatically decreases the turn-around time of physical design, providing a fast solution which is available prior to final layout release.

4 Claims, 3 Drawing Sheets

_SPACING VIOLATION CHECKER_

BACKGROUND OF THE INVENTION

1. Field of the Invention

The present invention generally relates to methods and systems for checking spacing of wiring in a semiconductor structure and more particularly to a method and system for checking the spacing of wiring within a single net.

2. Description of the Related Art

Conventional design rules require wires of the same net within a semiconductor structure to be spaced a specified minimum distance apart. A net can be defined as a set of logically connected shapes (typically terminals on logic gates) which are electrically connected when modeled physically. Older designs satisfied the minimum spacing requirements fairly easily through simplified grid designs which automatically guaranteed that minimum spacing design rules were met. However, with advancing technologies wider wires are more prevalent. Such wide wires have larger spacing requirements than the older narrower wires. Therefore, a simple gridded solution is no longer effective with today's current wide wires.

Minimum spacing violations were conventionally recognized during the shapes processing performed by Design Rules Check (DRC). Design Rules Check is an expensive and time consuming process which is usually run after the final physical design layout is complete. Further, correcting minimum spacing violations after the final physical design layout is complete is also a difficult and expensive process. Therefore, there is a conventional need for a system and method for checking a given net for spacing violations which is fast, inexpensive and can be performed before the final physical design layout is complete.

SUMMARY OF THE INVENTION

It is, therefore, an object of the present invention to provide a structure and method for testing spacing of wiring in a circuit comprising forming a plurality of conductor rectangles representative of conductors of the circuit, forming minimum spacing rectangles around the conductor rectangles (the minimum spacing rectangles being larger than respective ones of the conductor rectangles), identifying a possible error rectangle when a first conductor rectangle of the conductor rectangles occupies a portion of a minimum spacing rectangle of a second conductor rectangle of the conductor rectangles, checking whether the possible error rectangle is a true error, and reporting the true errors.

The checking process comprises classifying the possible error rectangle as a possible diagonal error rectangle or a possible non-diagonal error rectangle, determining that the possible diagonal error rectangle is not a true error when at least two adjacent sides of the possible diagonal error rectangle which connect the first conductor and the second conductor are covered by a third conductor of the conductors, and determining that the possible non-diagonal error rectangle is not a true error when the possible non-diagonal error rectangle is completely covered by the third conductor.

The process of forming minimum spacing rectangles comprises forming the minimum spacing rectangles to have sides which are a minimum spacing design constraint distance from sides of respective ones of the conductor rectangles.

The conductors are preferably within a single net. If the circuit comprises a plurality of nets the process further includes checking for shorts between different ones of the nets.

The invention can also include dividing the possible error rectangle into at least two possible error rectangle if the possible error rectangle is partially covered by a third conductor of the conductors.

The invention is superior to conventional systems because the invention allows same net spacing errors to be recognized during physical design prior to Design Rules Check. The software supporting the invention performs orders of magnitude faster than the Design Rules Check solution. As such, the invention dramatically decreases the turn-around time of physical design, providing a fast solution which is available prior to final layout release.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
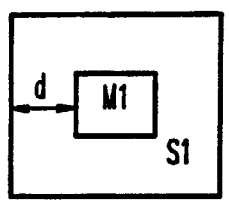
FIG. 1 is a schematic drawing of a metal shape and a minimum spacing rectangle surrounding the metal shape.

Referring now to the drawings, and more particularly to FIG. 1, a rectangle representing a conductor shape M1, such as a metal wiring, and a spacing rectangle S1, which defines a minimum space "d" according to design rules around the metal shape M1 are illustrated. The metal shape is a part of a larger overall conductive net within a structure, such as a semiconductor. The metal shape comprises circuit components which operate by transmission of signals through the net.

A first stage of the invention involves a plane sweep of all the net's components (e.g., net parts) such as vias, wires segments, pins or powers. The first rectangle M1 represents the shape of the net part and the second rectangle S1 represents the minimum spacing requirement surrounding the net part M1. The size of the second minimum spacing rectangle S1 is determined by the design rules for net part M1 such as the minimum space "d", as mentioned above. While the minimum spacing rectangles S1 are illustrated as true rectangles for clarity, the minimum spacing measure from the corners of the net part M1 is actually a radius, making the minimum spacing rectangles S1 take on a somewhat oval shape in real world applications.

Figure 2:
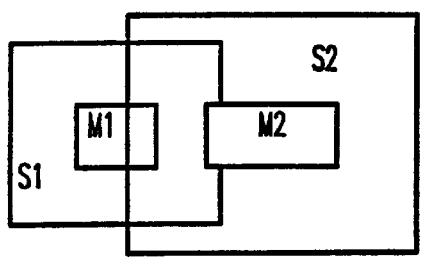
FIG. 2 is a schematic diagram of two metal shapes which overlap minimum spacing rectangles of the other.
Figure 3:
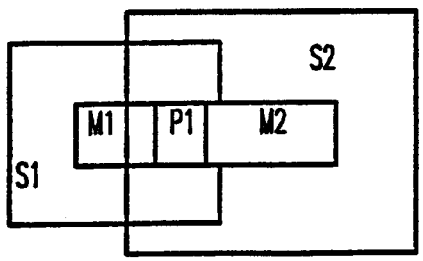
FIG. 3 is a schematic diagram of two metal shapes and their respective minimum spacing rectangles and a possible spacing error between the same.

FIG. 2 illustrates two metal shapes M1 and M2 and their respective minimum spacing rectangles S1 and S2. When one metal shape falls within the minimum spacing rectangle of another metal shape, as shown in FIG. 2, the invention compares the shortest distance between the metal shapes to the spacing requirement for the metal shapes and, if the shortest distance is less than the required distanced, the invention identifies a possible spacing error and forms a possible error rectangle P1, as illustrated in FIG. 3.

Figure 4:
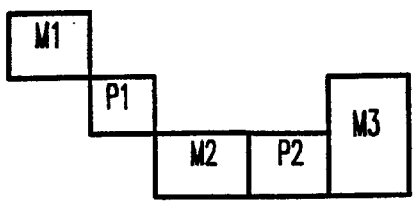
FIG. 4 is a schematic diagram of metal shapes and potential diagonal and horizontal spacing violations.

Once all possible error rectangles have been determined and a list of possible spacing errors created, the invention seeks to eliminate possible error rectangles from the possible error list. The invention classifies each spacing error as non-diagonal or diagonal. A possible diagonal spacing error P1 is illustrated in FIG. 4 between metal shapes M1 and M2. FIG. 4 also illustrates a possible non-diagonal (e.g., a horizontal or vertical) error P2.

The invention determines whether a non-diagonal possible spacing error constitutes an actual spacing error by examining if the possible error rectangle is covered by other metal. If the non-diagonal possible spacing rectangle is entirely covered by another conductor (e.g., other metal), no error exists, and the invention removes the possible spacing error rectangle from the possible error list.

Figure 5:
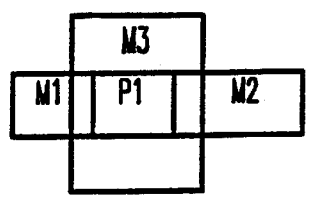
FIG. 5 is a revised schematic diagram of FIG. 3 illustrating a potential spacing violation which is not an error.

For example, as illustrated in FIG. 5, metal shape M3 completely covers possible error P1. Therefore, since no actual space exists between metal shapes M1 and M2, the possible error rectangle P1 illustrated in FIG. 5 is not a true spacing error and is properly removed from the possible error list.

Figure 6:
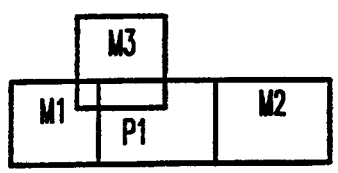
FIG. 6 is a revised schematic diagram of FIG. 5 illustrating a potential spacing violation which is an error.
Figure 7:
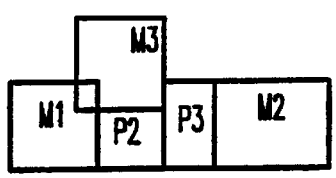
FIG. 7 is a revised schematic drawing of FIG. 6 showing divided potential spacing violations.

FIG. 6 illustrates a metal shape M3 which only partially covers the possible spacing error in P1. In such a situation, the invention creates multiple possible spacing error rectangles (e.g. P2, P3) from the original possible spacing error P1, as illustrated in FIG. 7. The possible spacing error P1 is removed from the possible error list and the newly created possible spacing errors (e.g. P2, P3) are added to the possible error list. Each of the newly created possible spacing errors (e.g. P2, P3) will subsequently be evaluated to determine if the new possible spacing error rectangle is totally covered by other metal in the same fashion.

The process for determining whether a non-diagonal possible spacing errors is an actual error is discussed above. For diagonal possible spacing errors different techniques are utilize and are discussed below with respect to FIGS. 8–10.

Figure 8:
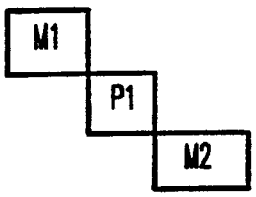
FIG. 8 is a schematic diagram illustrating metal shapes and a diagonal spacing violation.

More specifically, FIG. 8 illustrates a diagonal possible spacing error P1 between metal shapes M1 and M2. The diagonal measure of rectangle P1 is less than the minimum spacing constraint of the design rules and no other metal shapes in the design intersect the P1 rectangle. Therefore, the possible error rectangle P1 shown in FIG. 8 would be considered a true spacing violation and reported as an error.

Figure 9:
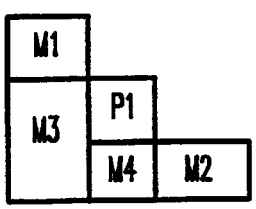
FIG. 9 is a revised schematic illustration of FIG. 8 which includes additional metal shapes which removes the spacing violation.

FIG. 9 is similar to FIG. 8 except for the addition of two metal shapes M3, M4. The invention recognizes that, collectively, metal shapes M3, M4 entirely intersect two adjacent edges of the possible spacing error P1 and that these intersected edges connect the metal shapes M1 and M2. In this situation, the possible spacing error is not an actual error and the invention removes the potential spacing error P1 shown in FIG. 9 from the possible error list.

Figure 10:
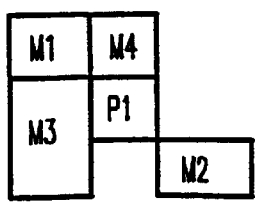
FIG. 10 is a revised schematic illustration of FIG. 8 illustrating additional metal shapes which do not remove the spacing violation.

Continuing with the same example, FIG. 10 is similar to FIG. 9 except the edges of P1 which are entirely intersected by metal shapes M3 and M4 do not connect the metal shapes M1 and M2. In this situation, the possible spacing error is an actual error and will be reported as an error.

The remaining possible error rectangles violate the minimum spacing constraints of the design rules, are considered true violations and are reported as errors.

In another embodiment of the invention, to increase the speed of the invention, the analysis can be limited to metal shapes within the same net. A second system and computer programs, which are well known to those ordinarily skilled in the art, which checks for shorts between different nets, would determine whether the minimum spacing violations existed between different nets. Therefore, if such a second computer program is utilized, the present invention can be limited to a single net. By limiting the invention to a single net, the invention works much faster because the complexity and number of the rectangles analyzed is reduced.

Figure 11:
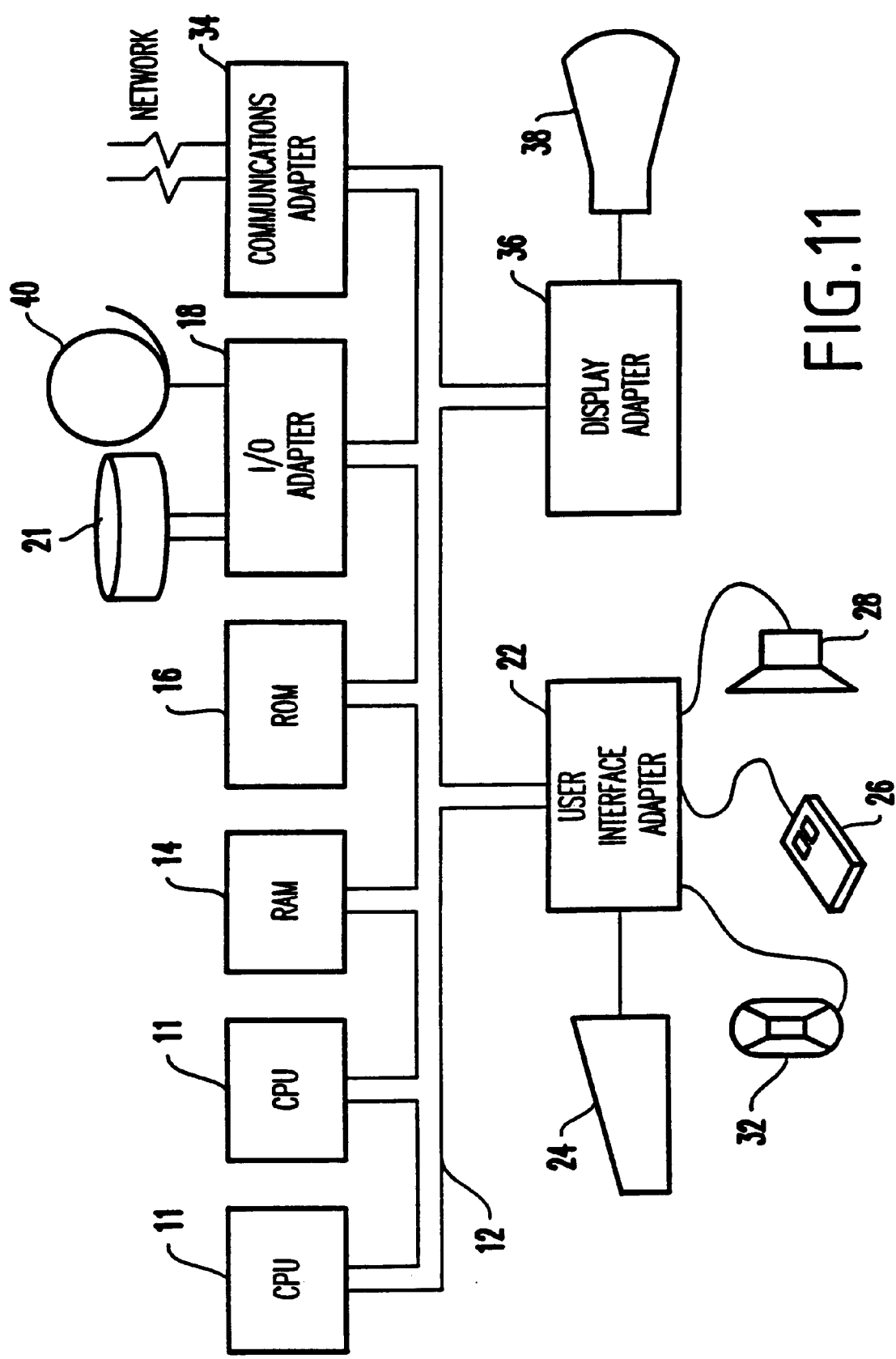
FIG. 11 is a schematic diagram of a computer system and software program for performing the invention.

While the overall methodology of the invention is described above, the invention can be embodied in any number of different types of systems and executed in any number of different ways, as would be known by one ordinarily skilled in the art. For example, as illustrated in FIG. 11, a typical hardware configuration of an information handling/computer system in accordance with the invention preferably has at least one processor or central processing unit (CPU) 11. The CPUs 11 are interconnected via a system bus 12 to a random access memory (RAM) 14, read-only memory (ROM) 16, input/output (I/O) adapter 18 (for connecting peripheral devices such as disk units 21 and tape drives 40 to the bus 12), user interface adapter 22 (for connecting a keyboard 24, mouse 26, speaker 28, microphone 32, and/or other user interface device to the bus 12), communication adapter 34 (for connecting an information handling system to a data processing network), and display adapter 36 (for connecting the bus 12 to a display device 38).

Figure 12:
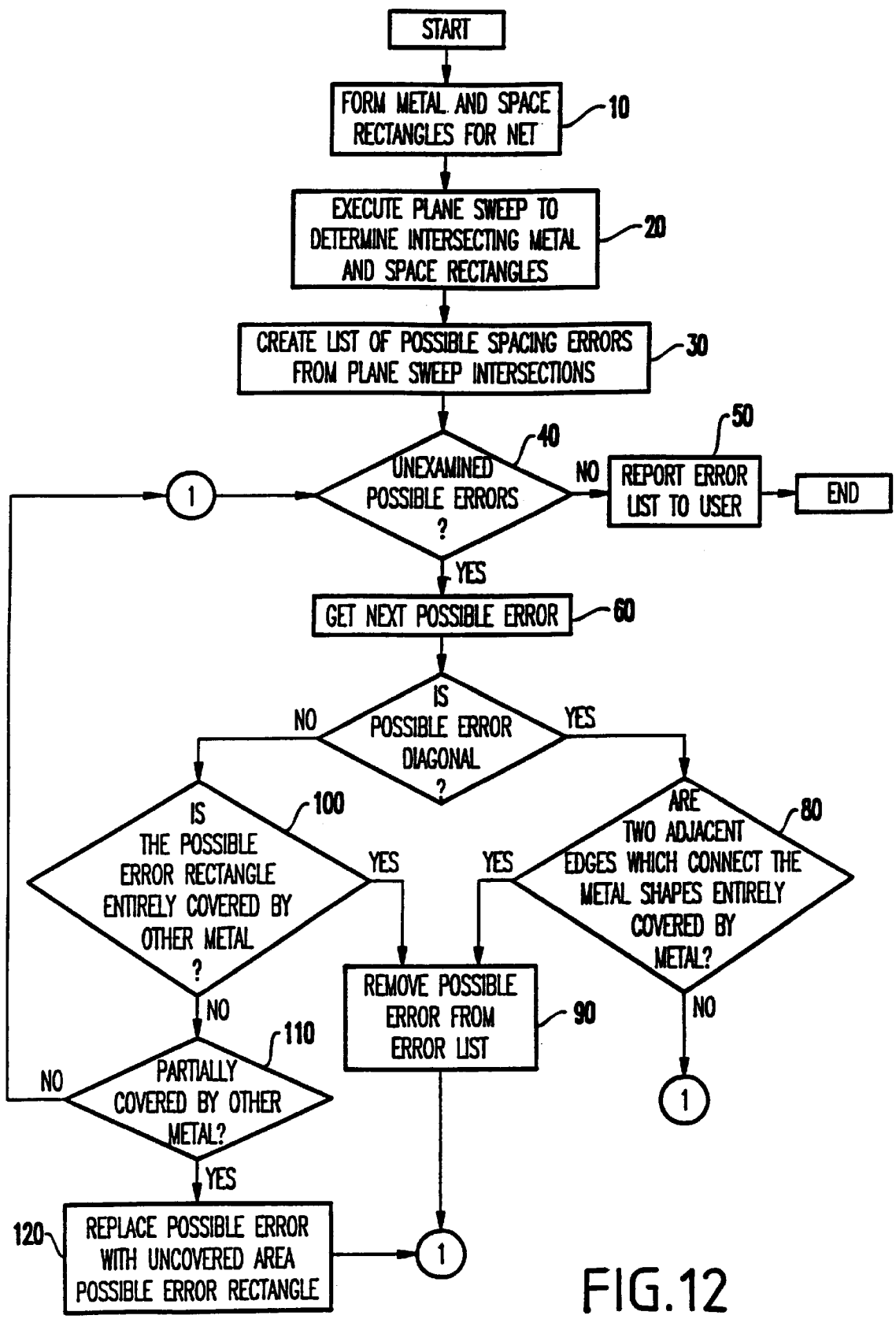
FIG. 12 is a flowchart illustrating an embodiment of the invention.

A flowchart of the foregoing embodiment of the invention is shown in FIG. 12. More specifically, in block 10 the metal and space rectangles are formed for all metal shapes within the net, as discussed above. In block 20 the rectangles are compared using a plane sweep algorithm to determine which metal and space rectangles are intersecting. From this information, block 30 creates the initial list of possible spacing errors.

Block 40 begins a loop through the list of possible spacing errors. If there are any unexamined possible spacing errors, the flow continues to block 60 where the next possible spacing error is located. In block 70 the possible spacing error is classified as either diagonal or non-diagonal.

In block 80 diagonal errors are tested to determine if two adjacent edges of the possible spacing error rectangle which connect the metal shapes comprising the error are entirely covered by other metal shapes of the net. If so, in block 90 the possible spacing error is removed from the error list. The flow loops back through 1 to block 40.

In block 100 non-diagonal errors are tested to determine if the possible spacing error rectangle is entirely covered by metal shapes of the net. If so, in block 90 the possible spacing error is removed from the error list. If not, the possible spacing error rectangle is tested to determine if it is partially covered by other metal shapes of the net If so, the possible spacing error is replaced by one or more new possible spacing errors representing the area of the original possible spacing error rectangle which is not covered by metal shapes of the net. The flow loops back through 1 to block 40.

Once all possible spacing errors have been examined, the invention reports the remaining possible spacing errors to the user in block 50 and the flowchart ends.

Similarly, the invention could preferably be embodied in any number of software programs. For example, one computer program, or portion of a computer program, could determine whether a potential spacing error exists and whether the possible spacing error is diagonal or non-diagonal. An example of the pseudo-code for such a software program follows.

```
activeList = empty
netPartList = empty
possibleErrorList = empty
diagonalPossibleErrorList = empty
For each net part
    add space rectangle keyed by it's low x
        coordinate to netPartList
    add space rectangle keyed by it's high x
        coordinate to netPartList
endFor
Sort netPartList
// Iterate through netPartList
while (sortedNetPart = getNext(netPartList))
    if (sortedNetPart key is low x)
        For every activeListNetPart in activeList
*See NOTE
            Compare (sortedNetPart, activeListNetpart)
        endFor
        add sortedNetPart to activeList
    else
        delete sortedNetPart from activeList
endWhile
Compare (netPart1, netPart2)
    if netPart1 and netPart2 metal rectangles do not
        intersect
        if netPart1 space rectangle intersects
            netPart2 metal rectangle
                OR
            netPart2 space rectangle intersects netPart1
                metal rectangle
            Compute distance between metal shapes
            if distance < spacing requirement
                Add intersection of the two space
                    rectangles to either
                    possibleErrorList or
                    diagonalpossibleErrorList
            endIf
        endIf
    endIf
endCompare
```

Note:
Rather than a simple iteration of the activeList in the loop above, many other possible data structure implementations could be applied to the activeList and the compare stage of the activeList processing. A radix search tree or priority search tree could improve performance if the number of net parts was very large.

Additionally, a computer program, or a portion of a computer program, could evaluate a possible non-diagonal spacing error to determine whether a possible non-diagonal error is actually a true error to be reported to the user.

More specifically, such a computer program or portion of a computer program could determine if a possible spacing error rectangle is covered by other metal in the design. The invention could remove a spacing error from the list of possible errors upon determining the possible spacing error rectangle is entirely covered by metal. Upon determining the possible spacing error rectangle is partially covered by metal, the invention could calculate new possible spacing error rectangles by subtracting the covered area from the initial possible spacing error rectangle and could replace the original possible spacing error with the newly created possible spacing errors. An example of the pseudo-code for such a software program follows.

```
// Iterate through net parts, stopping if
// possibleErrorList is empty
For each netPart and possibleErrorList is not empty
    // Iterate through possibleErrorList
    while (possibleError = getNext (possibleErrorList))
        If possibleError was not created from this
            netPart
            Intersect the netPart metal rectangle
                with the possibleError rectangle
            If the intersection rectangle is more
                than a line
                Subtract the intersection rectangle
                    area from the possibleError
                    rectangle, possibly
                        creating/deleting
                        possibleErrorList elements
            endIf
        endIf
    endWhile
endFor
// Any remaining possibleErrorList elements are errors
while (possibleError = getNext (possibleErrorList))
    Report possibleError rectangle as an error
endWhile
```

Additionally, a computer program, or a portion of a computer program, could evaluate a possible diagonal error to determine whether a possible diagonal error is actually a true error to be reported to the user.

More specifically, such a computer program or a portion of a computer program could evaluate whether additional metals exists which collectively intersect the edges of the diagonal possible spacing error rectangle and whether those edge intersections indicate a metal connection between the original metal rectangles comprising the possible spacing error.

The invention could compare the diagonal possible spacing error rectangle edges to the metal rectangles of all other net parts. As metal rectangles are found which intersect the edges, the invention could split, shorten or remove the edges of the possible error rectangle at the area of the intersection of the possible error rectangle and the metal rectangle. The invention could then evaluate the remaining edges to determine if two adjacent edges connecting the original metal shapes comprising the diagonal possible spacing error have been removed by this process and, if so, could remove the possible spacing error from the list of possible spacing errors. This situation is similar to that shown in FIG. 9.

However, if the edges of the possible diagonal error rectangle which have been removed do not connect the original metal shapes comprising the error, the possible spacing error would be considered a true spacing violation. This is similar to the situation shown in FIG. 10. An example of the pseudo-code for such a software program follows.

```
// Iterate through diagpossibleErrorList
while (possibleError = getNext (diagpossibleErrorList))
    if possibleError rectangle is a line
        create one edge
        // Iterate though net parts, stopping if
        // edge is null
        For each netPart and edge ! = NULL
            process_this_edge(netPart, edge)
        endfor
        if (edge = = NULL) // Edge totally removed
            remove possibleError from
                diagPossibleErrorList
        endif
    else // possibleError is a rectangle
```

```
                    create four edges (east, west, north, south)
                    still_error = true
                    // Iterate through net parts stopping if
                    // no longer an error
                    For each netPart and still_error
                        process_this_edge(netpart, edge_east)
                        process_this_edge_(netpart, edge_west)
                        process_this_edge_(netpart, edge_north)
                        process_this_edge (netPart, edge_south)
                    endfor
                    // Have the appropriate edges been removed?
                    if ((metal shapes are at the NE and SW
                        corners of possibleError rectangle) AND
                        ((edge_east = = NULL) &&
                        (edge_south = = NULL)) OR
                        ((edge_west = = NULL) &&
                        (edge_north = = NULL)))
                            still_error = false
                    endif
                    if ((metal shapes are at the NW and SE
                        corners of possibleError rectangle) AND
                        ((edge_west = = NULL) &&
                        (edge_south = = NULL)) OR
                        ((edge_east = = NULL) &&
                        (edge_north = = NULL)))
                            still_error = false
                    endif
                    if ( ! still_error )
                        remove possibleError from
                        diagPossibleErrorList
                    endif
                endif
        endwhile
        // Any remaining diagpossibleErrorList elements are
        // errors
        while (possibleError = getNext (diagpossibleErrorList))
            Report possible Error rectangle as an error
        endWhile
process_this_edge(netPart, edge_list)
        // Iterate through partial edges associated with
        // this edge
        while (partial_edge = getNext(edge_list))
            if netPart metal rectangle intersects
            partial_edge
                if intersection is entire partial edge
                    remove partial_edge from edge_list
                else
                    modify partial edge to reflect
                    remaining edge after intersection
                    possibly splitting into two
                    partial edges
                endIf
            endIf
        endWhile
endProcess_this_edge
```

Therefore, the invention is superior to conventional systems because the invention allows same net spacing errors to be recognized during physical design prior to Design Rules Check. The software supporting the invention performs orders of magnitude faster than the Design Rules Check solution. As such, the invention dramatically decreases the turn-around time of physical design, providing a fast solution which is available prior to final layout release.

The invention is general in nature and can be applied to any application which can represent the application data as a set of connected rectangles and a set of spacing constraints. For example, any application which architects nets, such as mazes for mice or other objects to pass through, might wish to ensure the spacing in the structure would meet a minimum requirement so that the mice or other objects do not get stuck.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A process of testing spacing of wiring in a circuit comprising:

forming a plurality of conductor rectangles representative of conductors of said circuit;

forming minimum spacing rectangles around said conductor rectangles, said minimum spacing rectangles being larger than respective ones of said conductor rectangles;

identifying a possible error rectangle when a first conductor rectangle of said conductor rectangles occupies a portion of a minimum spacing rectangle of a second conductor rectangle of said conductor rectangles;

checking whether said possible error rectangle is a true error; and reporting said true errors;

wherein said checking comprises:

classifying said possible error rectangle as a possible diagonal error rectangle or a possible non-diagonal error rectangle;

determining that said possible diagonal error rectangle is said not a true error when at least two adjacent sides of said possible diagonal error rectangle which intersect said first conductor and said second conductor are covered by a third conductor of said conductors; and determining that said possible non-diagonal error rectangle is not a true error when said possible non-diagonal error rectangle is completely covered by said third conductor.

2. A process of testing spacing of elements in a structure comprising:

forming a plurality of element rectangles representative of elements of said structure;

forming minimum spacing rectangles around said element rectangles, said minimum spacing rectangles being larger than respective ones of said element rectangles;

identifying a possible error rectangle when a first element rectangle of said element rectangles occupies a portion of a minimum spacing rectangle of a second element rectangle of said element rectangles;

checking whether said possible error rectangle is a true error; and reporting said true errors;

wherein said checking comprises:

classifying said possible error rectangle as a possible diagonal error rectangle or a possible non-diagonal error rectangle;

determining that said possible diagonal error rectangle is said not a true error when at least two adjacent sides of said possible diagonal error rectangle which intersect said first element and said second element are covered by a third element of said elements; and determining that said possible non-diagonal error rectangle is not a true error when said possible non-diagonal error rectangle is completely covered by said third element.

3. A computer system for testing spacing of wiring in a circuit comprising:

a unit for forming a plurality of conductor rectangles representative of conductors of said circuit;

a unit for forming minimum spacing rectangles around said conductor rectangles, said minimum spacing rectangles being larger than respective ones of said conductor rectangles;

a unit for identifying a possible error rectangle when a first conductor rectangle of said conductor rectangles occupies a portion of a minimum spacing rectangle of a second conductor rectangle of said conductor rectangles;

a unit for checking whether said possible error rectangle is a true error; and a unit for reporting said true errors;

wherein said unit for checking comprises:
- a unit for classifying said possible error rectangle as a possible diagonal error rectangle or a possible non-diagonal error rectangle;
- a unit for determining that said possible diagonal error rectangle is said not a true error when at least two adjacent sides of said possible diagonal error rectangle which intersect said first conductor and said second conductor are covered by a third conductor of said conductors; and
- a unit for determining that said possible non-diagonal error rectangle is not a true error when said possible non-diagonal error rectangle is completely covered by said third conductor.

4. A computer program product comprising a program storage device readable by a computer system tangibly embodying a program of instructions executed by said computer system to perform a process for testing spacing of wiring in a circuit, said process comprising:

forming a plurality of conductor rectangles representative of conductors of said circuit;

forming minimum spacing rectangles around said conductor rectangles, said minimum spacing rectangles being larger than respective ones of said conductor rectangles;

identifying a possible error rectangle when a first conductor rectangle of said conductor rectangles occupies a portion of a minimum spacing rectangle of a second conductor rectangle of said conductor rectangles;

checking whether said possible error rectangle is a true error; and reporting said true errors;

wherein said checking comprises:
- classifying said possible error rectangle as a possible diagonal error rectangle or a possible non-diagonal error rectangle;
- determining that said possible diagonal error rectangle is said not a true error when at least two adjacent sides of said possible diagonal error rectangle which intersect said first conductor and said second conductor are covered by a third conductor of said conductors; and
- determining that said possible non-diagonal error rectangle is not a true error when said possible non-diagonal error rectangle is completely covered by said third conductor.

* * * * *